United States Patent
Imai et al.

(10) Patent No.: US 10,374,050 B2
(45) Date of Patent: Aug. 6, 2019

(54) SILICON CARBIDE SEMICONDUCTOR DEVICE AND MANUFACTURING METHOD OF SILICON CARBIDE SEMICONDUCTOR DEVICE

(71) Applicant: FUJI ELECTRIC CO., LTD., Kawasaki-shi, Kanagawa (JP)

(72) Inventors: Fumikazu Imai, Kawasaki (JP); Tsunehiro Nakajima, Kawasaki (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 178 days.

(21) Appl. No.: 14/960,293

(22) Filed: Dec. 4, 2015

(65) Prior Publication Data

US 2016/0087061 A1    Mar. 24, 2016

Related U.S. Application Data

(63) Continuation of application No. PCT/JP2014/079630, filed on Nov. 7, 2014.

(30) Foreign Application Priority Data

Nov. 22, 2013   (JP) .................................. 2013-242368

(51) Int. Cl.
   *H01L 29/45*   (2006.01)
   *H01L 21/04*   (2006.01)
   *H01L 29/16*   (2006.01)
   *C23C 14/18*   (2006.01)

(52) U.S. Cl.
   CPC ............ *H01L 29/45* (2013.01); *C23C 14/185* (2013.01); *H01L 21/0485* (2013.01); *H01L 29/1608* (2013.01)

(58) Field of Classification Search
   CPC ............ H01L 21/0445; H01L 21/0485; H01L 29/1608; H01L 29/66053; H01L 2924/10272; H01L 29/45; C23C 14/185
   See application file for complete search history.

(56) References Cited

U.S. PATENT DOCUMENTS 7,297,626 B1    11/2007   Cole et al.
2006/0273323 A1*  12/2006   Yamamoto .......... H01L 21/0485
                                                         257/77

(Continued)

FOREIGN PATENT DOCUMENTS

JP    2003-243323 A    8/2003
JP    2007-184571 A    7/2007

(Continued)

OTHER PUBLICATIONS

Machine traslation of Satoshi (JP 2008-130874), (hereinafter, Satoshi).*

(Continued)

Primary Examiner — Yasser A Abdelaziez
(74) Attorney, Agent, or Firm — Rabin & Berdo, P.C.

(57) ABSTRACT

A titanium layer and a nickel layer are sequentially formed on a back surface of a SiC wafer. Next, by high-temperature heat treatment, the SiC wafer is heated and the titanium layer and the nickel layer are sintered forming a nickel silicide layer that includes titanium carbide. By this high-temperature heat treatment, an ohmic contact of the SiC wafer and the nickel silicide layer is formed. Thereafter, on the nickel silicide layer, a back surface electrode multilayered structure is formed by sequentially stacking a titanium layer, a nickel layer, and a gold layer. Here, in forming the nickel layer that configures a back surface electrode multilayered structure, the nickel layer is formed under a condition that satisfies $0.0 < y < -0.0013x + 2.0$, where the thickness of the nickel layer is x [nm] and the deposition rate of the nickel layer is y [nm/second]. Thus, peeling of the back surface electrode can be suppressed.

10 Claims, 3 Drawing Sheets

(56) References Cited

U.S. PATENT DOCUMENTS

| | | | |
|---|---|---|---|
| 2007/0138482 A1 | 6/2007 | Tanimoto | |
| 2009/0057906 A1 | 3/2009 | Buchoff et al. | |
| 2014/0051241 A1 | 2/2014 | Kinoshita et al. | |
| 2014/0061674 A1* | 3/2014 | Imai | H01L 29/45 257/77 |
| 2014/0346531 A1 | 11/2014 | Imai | |
| 2015/0056786 A1 | 2/2015 | Kinoshita et al. | |

FOREIGN PATENT DOCUMENTS

| | | |
|---|---|---|
| JP | 2008-053291 A | 3/2008 |
| JP | 2008-130874 A | 6/2008 |
| JP | 2008-227405 A | 9/2008 |
| JP | 2010-086999 A | 4/2010 |
| JP | 2011-054698 A | 3/2011 |
| JP | 2012-248729 A | 12/2012 |
| WO | WO 2012-137959 A1 | 10/2012 |
| WO | WO 2012-165513 A1 | 12/2012 |
| WO | WO 2013-125596 A1 | 8/2013 |
| WO | WO 2013-146328 A1 | 10/2013 |

OTHER PUBLICATIONS

Mitra et al. ("Effect of process variables on the structure, residual stress, and hardness of sputtered nanocrystalline nickel films," J. Mater. Res., vol. 16, No. 4, Apr. 2001, pp. 1010-1027, Apr. 2001).*

* cited by examiner

| | | Ni LAYER THICKNESS (nm) | | | | | |
|---|---|---|---|---|---|---|---|
| | | 300 | 400 | 500 | 700 | 900 | 1200 |
| Ni DEPOSITION RATE (nm/SECOND) | 0.3 | ○ | ○ | ○ | △ | △ | △ |
| | 0.5 | ○ | ○ | △ | △ | △ | × |
| | 0.7 | ○ | △ | △ | △ | △ | × |
| | 0.9 | △ | △ | △ | △ | × | × |
| | 1.2 | △ | △ | △ | × | × | × |

○: NO PEELING
△: NEGLIGIBLE PEELING
×: PEELING

SILICON CARBIDE SEMICONDUCTOR DEVICE AND MANUFACTURING METHOD OF SILICON CARBIDE SEMICONDUCTOR DEVICE

CROSS REFERENCE TO RELATED APPLICATIONS

This is a continuation application of International Application PCT/JP2014/079630 filed on Nov. 7, 2014 which claims priority from a Japanese Patent Application No. 2013-242368 filed on Nov. 22, 2013, the contents of which are incorporated herein by reference.

BACKGROUND OF THE INVENTION

1. Field of the Invention

The present invention relates to a silicon carbide semiconductor device and a manufacturing method of the silicon carbide semiconductor device.

2. Description of the Related Art

Among semiconductor devices conventionally used as power devices, those using silicon (Si) as a semiconductor material have become mainstream. Compared to silicon, silicon carbide (SiC) has a wider bandgap (hereinafter, wide gap semiconductor) and physical properties such as a thermal conductivity that is 3 times that of silicon, a critical electric field strength that is 10 times that of silicon, and electron drift velocity that is 2 times that of silicon. Therefore, research concerning the application of silicon carbide in the production (manufacturing) of a power device that is capable of high temperature operation with low loss and for which the dielectric breakdown voltage is high, is being actively pursued by institutions.

A mainstream structure of such a power device is a vertical semiconductor device having a back surface electrode equipped with a low resistance ohmic electrode in the back surface side. Various materials and structures are used for the back surface electrode of a vertical semiconductor device. For instance, surface electrodes have been proposed that are respectively formed by stacked layers including a titanium (Ti) layer, a nickel (Ni) layer, and a silver (Ag) layer (for example, refer to Japanese Laid-Open Patent Publication No. 2007-184571); and a titanium layer, a nickel layer, and a gold layer (for example, refer to Japanese Laid-Open Patent Publication No. 2010-86999).

For example, a method has been proposed where, in a vertical semiconductor device that uses silicon carbide and is typified by a Schottky barrier diode (SBD), a nickel layer is formed on a semiconductor substrate of silicon carbide (hereinafter, SiC substrate) and thereafter, the nickel layer is subjected to heat treatment to form a nickel silicide layer, whereby contact (electrical contact unit) of the SiC substrate and the nickel silicide layer is an ohmic contact (for example, refer to Japanese Laid-Open Patent Publication Nos. 2007-184571 and 2010-86999). Nonetheless, in Japanese Laid-Open Patent Publication Nos. 2007-184571 and 2010-86999, a problem arises in that when the back surface electrode is formed on the nickel silicide layer, the back surface electrode is prone to peel from the nickel silicide layer.

To resolve such a problem, a method has been proposed where after the nickel layer remaining on the surface of the nickel silicide layer has been removed exposing the nickel silicide layer, the back surface electrode is formed by sequentially stacking on the nickel silicide layer, the titanium layer, the nickel layer, and gold layer, whereby the peeling of the back surface electrode is suppressed (for example, refer to Japanese Laid-Open Patent Publication No. 2008-53291). Another method has been proposed where after a metal carbide formed on the surface of the nickel silicide layer has been removed, the back surface electrode is formed on the nickel silicide layer, whereby the adhesion of the back surface electrode is improved (for example, refer to Japanese Laid-Open Patent Publication No. 2003-243323).

Nonetheless, even if the back surface electrode is formed using the techniques of Japanese Laid-Open Patent Publication No. 2008-53291 or Japanese Laid-Open Patent Publication No. 2003-243323, the adhesion of the nickel silicide layer and the titanium layer, which is the lowest layer of the back surface electrode, is poor and when the semiconductor wafer is diced (cut) into chips, the back surface electrode peels from the nickel silicide layer. For example, in Japanese Laid-Open Patent Publication No. 2008-53291, the nickel layer is formed on the SiC substrate and thereafter, heat treatment is subsequently performed, whereby the nickel silicide layer is formed, and the ohmic contact of the SiC substrate and the nickel silicide layer is formed. According to Japanese Laid-Open Patent Publication No. 2007-184571, the nickel silicide layer is generated by a solid-phase reaction of silicon carbide and nickel, indicated below as equation (1).

$$Ni+2SiC \rightarrow NiSi_2+2C \qquad (1)$$

Carbon (C) resulting from the reaction of equation (1) exists dispersed throughout the nickel silicide layer as very fine precipitate or in an over-saturated state in which the crystals are unstable. The carbon dispersed in the nickel silicide layer is discharged all at once and precipitates (agglomerates) in a layer as a precipitate, such as graphite, on the surface of and inside the nickel silicide layer by heat treatment performed after the formation of the nickel silicide layer. The precipitate resulting from the agglomeration of this carbon is brittle and has poor adhesion; and therefore, even with the slightest stress, easily fractures, whereby the back surface electrode formed on the nickel silicide layer peels.

SUMMARY OF THE INVENTION

It is an object of the present invention to at least solve the above problems in the conventional technologies.

According to one aspect of the invention, a silicon carbide semiconductor device includes a metal layer disposed on a semiconductor substrate of silicon carbide and forming an ohmic contact with the semiconductor substrate; and a metal electrode multilayered structure formed by sequentially stacking at least a titanium layer and a nickel layer on the metal layer, where residual stress of the nickel layer is 200 MPa or less.

According to another aspect, the residual stress of the nickel layer is 100 MPa or less.

According to yet another aspect of the invention, the nickel layer is formed under a condition satisfying $0.0 < y < -0.0013x+2.0$, where thickness of the nickel layer is x [nm] and deposition rate of the nickel layer is y [nm/second].

According to still another aspect, the nickel layer is formed to under a condition satisfying $0.0 < y < -0.0015x+1.2$.

According to another aspect, the metal layer is a nickel silicide layer that includes titanium carbide.

According to yet another aspect of the invention, a manufacturing method of a silicon carbide semiconductor device, includes forming a metal layer on a semiconductor substrate of silicon carbide; forming an ohmic contact of the semiconductor substrate and the metal layer by heat treatment; and forming a metal electrode multilayered structure by sequentially stacking at least a titanium layer and a nickel layer on the metal layer. The forming of the metal electrode multilayered structure includes forming the nickel layer under a condition satisfying $0.0<y<-0.0013x+2.0$, where thickness of the nickel layer is x [nm] and deposition rate of the nickel layer is y [nm/second].

According to still another aspect, the forming of the metal electrode multilayered structure includes forming the nickel layer under a condition satisfying $0.0<y<-0.0015x+1.2$.

According to another aspect, the forming of the metal electrode multilayered structure includes forming the nickel layer by a vapor-deposition method.

According to another aspect, the forming of the metal layer includes forming on the semiconductor substrate, the metal layer, which includes titanium and nickel, and the forming of the ohmic contact includes reacting the semiconductor substrate and the metal layer by heat treatment, forming a nickel silicide layer that includes titanium carbide, and forming an ohmic contact of the semiconductor substrate and the nickel silicide layer.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Figure 1:
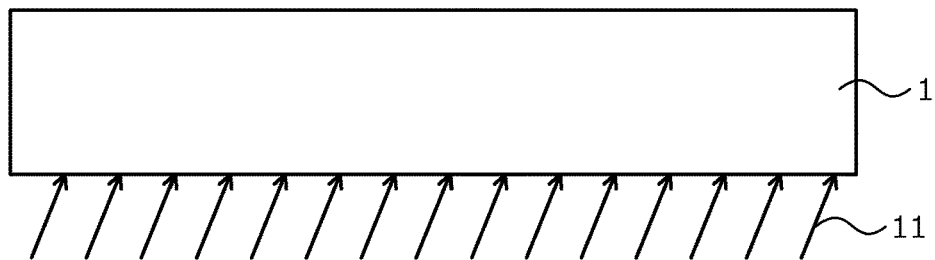
FIG. 1 is a cross-sectional view of a silicon carbide semiconductor device according to an embodiment, during manufacturing.

Preferred embodiments of a silicon carbide semiconductor device and a manufacturing method of the silicon carbide semiconductor device will be described in detail with reference to the accompanying drawings. In the present specification and the accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

A structure of the silicon carbide semiconductor device according to an embodiment will be described. The silicon carbide semiconductor device according to the embodiment includes a back surface electrode having an ohmic contact that is a contact (electrical contact unit) making contact with the semiconductor substrate of silicon carbide (SiC) (hereinafter, SiC substrate). The back surface electrode is formed by sequentially stacking on the SiC substrate, a nickel silicide layer (metal layer forming an ohmic contact with the SiC substrate) and a back surface electrode multilayered structure (metal electrode multilayered structure). The back surface electrode multilayered structure is formed by stacking sequentially from the nickel silicide layer, for example, a titanium (Ti) layer, a nickel (Ni) layer, and a gold (Au) layer. Inside the SiC substrate, semiconductor regions are provided according to the device structures. The device structures (front surface electrode, semiconductor region inside the SiC substrate, etc.) of the silicon carbide semiconductor device are changeable in various ways according to design conditions and therefore, description thereof is omitted.

In forming the back surface electrode of the silicon carbide semiconductor device according to the present invention, for example, first, in the back surface of a semiconductor wafer of silicon carbide (hereinafter, SiC wafer), a metal layer that includes titanium and nickel is formed using a metal deposition apparatus such as a sputtering apparatus, a vacuum deposition apparatus, etc. Subsequently, the SiC wafer is subject to high-temperature heat treatment to sinter the metal layer that includes titanium and nickel, and form a nickel silicide layer that includes titanium carbide (TiC). The ohmic contact of the SiC wafer and nickel silicide layer is formed by this high-temperature heat treatment. Thereafter, the back surface electrode multilayered structure is formed by sequentially stacking on the nickel silicide layer, a titanium layer, a nickel layer, and a gold layer.

The nickel silicide layer thus created (formed) and including titanium carbide exhibits favorable adhesion to the titanium layer, which is the lowest layer of the back surface electrode multilayered structure and therefore, has a function of suppressing the peeling of the back surface electrode multilayered structure. Furthermore, as a result of intensive studies, the inventors revealed that by reducing the internal stress (residual stress) remaining in the back surface electrode multilayered structure after formation thereof, the adhesion of the SiC substrate and nickel silicide layer and the adhesion of the nickel silicide layer and the back surface electrode multilayered structure can be enhanced, enabling further suppression of the peeling of the back surface electrode (nickel silicide layer and back surface electrode multilayered structure).

More specifically, the deposition rate and thickness of the nickel layer stacked on the titanium layer, which is the lowest layer of the back surface electrode multilayered structure, is optimized and the residual stress of the nickel layer is set to 200 MPa or less. To set the residual stress of the nickel layer to 200 MPa or less, deposition conditions when forming the nickel layer configuring the back surface electrode multilayered structure include satisfying expression (2) and preferably satisfying expression (3), where the thickness of the nickel layer is assumed as x [nm] and the deposition rate of the nickel layer is assumed as y [nm/second]. By forming the nickel layer, which configures the back surface electrode multilayered structure, according to deposition conditions that satisfy expression (2) (and preferably expression (3)), the residual stress of the nickel layer can be reduced and a back surface electrode multilayered structure that is resistant to peeling can be formed.

$$0.0 < y < -0.0013x + 2.0 \qquad (2)$$

$$0.0 < y < -0.0015x + 1.2 \qquad (3)$$

The manufacturing method of the silicon carbide semiconductor device according to the embodiment will be described in detail. FIGS. 1, 2, 3, 4, and 5 are cross sectional views of the silicon carbide semiconductor device according to the embodiment during manufacturing. Although description and drawings concerning formation processes of front surface device structures (front surface electrode and semiconductor region of the substrate front surface side) are omitted herein, front surface device structures suffice to be formed at a given timing by a general method in parallel with the formation of back surface device structures (back surface electrode and semiconductor region of substrate back surface side). In the formation of back surface device structures of the silicon carbide semiconductor device according to the embodiment, first, as depicted in FIG. 1, in the back surface of an n-type SiC wafer 1, for example, an n-type impurity such as phosphorus (P), etc. is implanted, ion implantation 11.

Subsequently, for example, using a rapid thermal annealing (RTA) apparatus equipped with an infrared lamp, heat is applied to the SiC wafer 1 and the n-type impurity implanted in the back surface of the SiC wafer 1 is activated. The heat treatment for activating the impurity, for example, may be performed in an argon (Ar) atmosphere at a temperature of about 1620 degrees C. for about 180 seconds. Consequent to the ion implantation 11 and heat treatment, an n-type semiconductor region (not depicted) of a higher impurity concentration than the SiC wafer 1 is formed in the surface layer of the back surface of the SiC wafer 1. Formation of the semiconductor region of a high impurity concentration in the back surface side of the SiC wafer 1 enables contact resistance of the SiC wafer 1 and a nickel silicide layer described hereinafter to be reduced.

Figure 2:
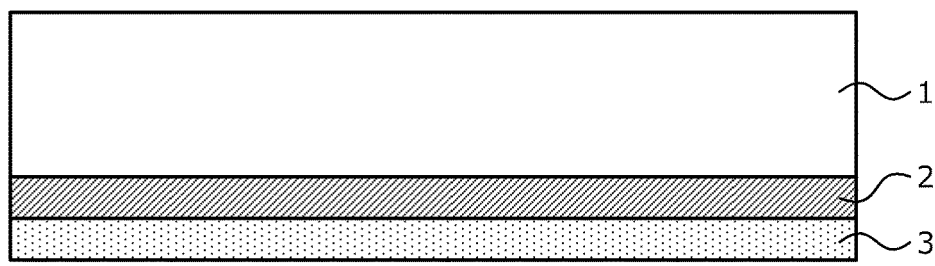
FIG. 2 is a cross-sectional view of the silicon carbide semiconductor device according to the embodiment, during manufacturing.

Subsequently, a protective resist film (not depicted) for surface protection and having a thickness of 2 μm is formed, for example, in the front surface of the SiC wafer 1 using, for example, a spin coating apparatus. Subsequently, for example, the native oxide formed on the back surface of the SiC wafer 1 is removed using a hydrofluoric acid buffer. Subsequently, for example, the protective resist film of the front surface of the SiC wafer 1 is removed using resist removal fluid. Subsequently, as depicted in FIG. 2, for example, a titanium layer 2 and a nickel layer 3 are sequentially deposited (formed) on the back surface of the SiC wafer 1 (i.e., on the n-type semiconductor region), using a metal deposition apparatus such as a sputtering apparatus. The thickness of the titanium layer 2 and the nickel layer 3, for example, may be about 60 nm and about 40 nm, respectively. In the case of the nickel silicide layer 4 described hereinafter, since the state of the nickel silicide layer 4 is determined by an annealing process after deposition, the deposition method of the precursor metal layer (the titanium layer 2 and the nickel layer 3) is irrelevant. However, the adhesion strength of the deposited film (metal layer) is higher for a sputtering method than a vapor-deposition method and therefore, when great weight is placed on preventing film peeling (peeling of the metal layer) after deposition, the metal layer that is to become the nickel silicide layer 4 is preferably deposited by a sputtering method.

In the case of a sputtering method, during deposition of the metal layer, the substrate (wafer) temperature becomes high. Therefore, after completion of the metal layer deposition (when returned to room temperature), although peeling may occur consequent to thermal stress, the phenomenon of this peeling occurs when the thickness of the nickel silicide layer 4 is set to be thick and when the nickel silicide layer 4 of a thickness of 100 nm or less is formed as with the present invention, no problems arise. Further, in the case of a back surface electrode layer (a back surface electrode multilayered structure 8 described hereinafter), the thickness of a nickel layer 6 configuring the back surface electrode layer is thick (about 400 nm in an example hereinafter) and therefore, if a sputtering method is used, the thermal stress change described above becomes great and peeling may occur. Therefore, when the back surface electrode layer is formed, use of a vapor-deposition method is preferable.

Figure 3:
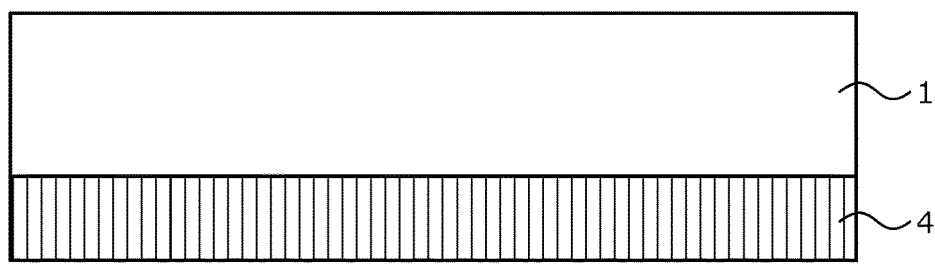
FIG. 3 is a cross-sectional view of the silicon carbide semiconductor device according to the embodiment, during manufacturing.

Subsequently, as depicted in FIG. 3, for example, a rapid thermal annealing apparatus equipped with an infrared lamp is used to apply heat to the SiC wafer 1, and the titanium layer 2 and the nickel layer 3 are sintered. The heat treatment for sintering, for example, may be performed in an argon atmosphere at a temperature of about 950 degrees C. for about 120 seconds. Consequent to this heat treatment, silicon (Si) atoms in the SiC wafer 1 react with nickel atoms in the nickel layer 3 to form the nickel silicide layer 4, and the ohmic contact of the SiC wafer 1 and the nickel silicide layer 4. Further, carbon (C) atoms in the SiC wafer 1 react with titanium atoms in the titanium layer 2 to generate titanium carbide in the nickel silicide layer 4.

Figure 4:
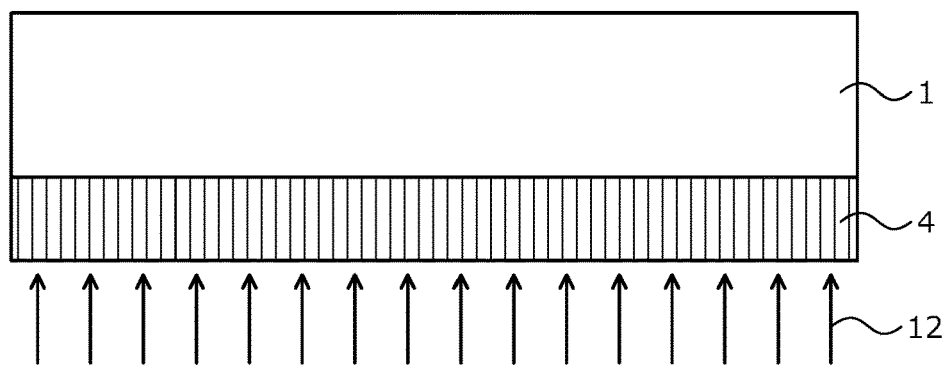
FIG. 4 is a cross-sectional view of the silicon carbide semiconductor device according to the embodiment, during manufacturing.

Subsequently, for example, the protective resist film (not depicted) that is for surface protection and of a thickness of, for example, 2 μm is formed in the front surface of the SiC wafer 1, using a spin coating apparatus. Subsequently, as depicted in FIG. 4, during the heat treatment for sintering, carbon atoms in the nickel silicide layer 4 precipitate in the front surface of the nickel silicide layer 4 (surface on the opposite side with respect to the SiC wafer 1 side) and the thin carbon precipitate layer formed (not depicted), for example, collides with ionized argon and is removed by ion milling 12, which removes impurities. The ion milling 12 to remove the carbon precipitate layer may be performed under a pressure of about 6 Pa for about 180 seconds at a high frequency (RF) power of about 300 W.

Figures 5, 6:
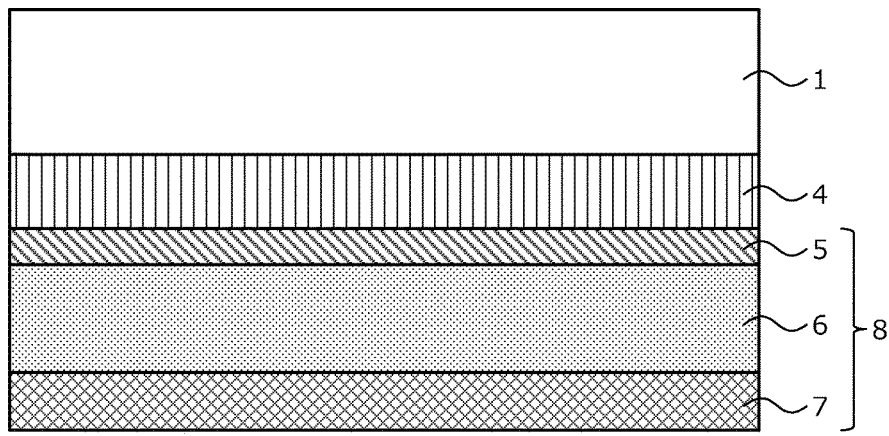
FIG. 5 is a cross-sectional view of the silicon carbide semiconductor device according to the embodiment, during manufacturing.
FIG. 6 is a chart depicting relations of back surface electrode adhesion and deposition conditions of a nickel layer configuring a back surface electrode multilayered structure of the silicon carbide semiconductor device according to the embodiment.

Subsequently, as depicted in FIG. 5, for example, a titanium layer 5, the nickel layer 6, and a gold (Au) layer 7 are sequentially vapor-deposited (formed) on the nickel silicide layer 4, using metal deposition apparatus such as a vapor-deposition apparatus to form the back surface electrode multilayered structure 8. Here, the nickel layer 6 configuring the back surface electrode multilayered structure 8 is formed by deposition conditions satisfying expression (2) (and preferably, expression (3)). The thicknesses of the titanium layer 5, the nickel layer 6, and the gold layer 7 configuring the back surface electrode multilayered structure 8, for example, may be 70 nm, 400 nm, and 200 nm, respectively. Thereafter, the SiC wafer 1 is diced (cut) into chip-shapes whereby, the silicon carbide semiconductor device according to the embodiment is completed.

Subsequently, relation of the residual stress of the nickel layer 6 configuring the back surface electrode multilayered structure 8 of the silicon carbide semiconductor device according to the embodiment and the adhesion of the back surface electrode (the nickel silicide layer 4 and the back surface electrode multilayered structure 8) will be described. The SiC wafer 1 (test specimen) was prepared in plural according to the manufacturing method of the silicon carbide semiconductor device of the above embodiment, to have a back surface electrode structure (the nickel silicide layer 4, the back surface electrode multilayered structure 8, and the semiconductor region of the substrate back surface side) (hereinafter, first practical example). The nickel layer 6 of each test specimen of the first practical example was of a different thickness formed by deposition rates that differ and range from 0.3 nm/second to 1.2 nm/second. The thickness of the titanium layer 5 was equivalent, 70 nm, for each test specimen and the thickness of the gold layer 7 was equivalent, 200 nm, for each test specimen. Front surface device structures were not formed.

The residual stress of the nickel layer 6 configuring the back surface electrode multilayered structure 8 was first evaluated for the test specimens of the first practical example. More specifically, the test specimens (semiconductor wafers) were attached to a test specimen holder and X-ray diffraction patterns were measured using a wide-angle X-ray diffraction (micro X-ray diffraction) technique to evaluate the residual stress of a central portion of the wafer. In the stress evaluation, using a sin 2ψ method (side inclination method), the diffraction peak of a (331) surface of nickel was used as an index of residual stress evaluation. Orientation estimation was performed using an X-ray dispersion apparatus (model: D8 DISCOVER μHR Hybrid (registered tradename)) of Bruker AXS GmbH. CuKα rays (a collimated beam optical system using a multilayer mirror) were used as the X-ray source, while the voltage and current of the X-ray tube were set as 50 kV and 22 mA, respectively. A pinhole slit of a 1-millimeter diameter was used for the divergence slit determining the width of the input X-ray.

A two-dimensional position sensitive proportional counter (PSPC) was used as a detector. The position of the detector was fixed to a diffraction angle 2θ=135.4 degrees. The incident angle ω of the X-rays to the test specimen was fixed to a nickel (331) surface Bragg angle $θ_0$=72.335 degrees. X-ray dispersion patterns were measured when the angle ψ formed by the normal of test specimen and the normal of the crystal lattice plane was 0 degrees, 20 degrees, 30 degrees, 40 degrees, 50 degrees, 60 degrees, and 70 degrees. The cumulative time per frame was set to 600 seconds/frame. For each test specimen of the first practical example, the lattice plane interval of the test specimen (d value) was measured by an X-ray dispersion apparatus and from changes in the lattice plane intervals, residual stress σ [MPa] on the test specimen was calculated.

In the calculation of residual stress σ, equation (4) was used. In equation (4), E represents Young's modulus [MPa], υ represents Poisson's ratio, and $θ_0$ represents Bragg's angle. In each test specimen of the first practical example, in the calculation of the residual stress σ of the nickel layer 6, Young's modulus E and Poisson's ratio υ for nickel were set as 199000 MPa and 0.31, respectively. Furthermore, $2θ/\sin^2 ψ$ was calculated from the slope of a graph ($\sin^2 ψ$-2θ graph) plotting the diffraction angle 2θ for each ψ angle.

$$\sigma = -\frac{E}{2(1+v)}\cot\theta_0 \frac{\partial(2\theta)}{\partial(\sin^2\phi)} \quad (4)$$

Subsequently, the adhesion of the back surface electrode (the nickel silicide layer 4 and the back surface electrode multilayered structure 8) of the silicon carbide semiconductor device according to the embodiment was evaluated. For each test specimen (semiconductor wafer) of the first practical example, after dicing tape having dicing frames was attached to the back surface electrode side (i.e., on the back surface electrode multilayered structure 8) of the test specimen, the test specimen was diced into 5 mm×5 mm chips. For the dicing, a dicing apparatus (Model: DAD3350 (registered trade name)) and a dicing blade (Model: NBC-Z, outer diameter×thickness×inner diameter: 56 mm×0.05 mm×40 mm) of DISCO Corporation were used. The rotational speed of the spindle (rotational axis) was set to be 40000 rpm, the feed rate was set to be 1 mm/second, and the cutting amount (depth at which the dicing blade penetrates the test specimen and cuts the dicing tape) was set to be 0.045 mm. Dicing tape (T-80MB (registered trade name)) manufactured by DENKA Company Ltd. was used.

When the chips were removed from the tape, whether the back surface electrode remained on the dicing tape side was checked and an edge portion along the outer perimeter of the back surface electrode was visually (under a microscope) checked to confirm whether there was back surface electrode peeling. The results are depicted in FIG. 6. FIG. 6 is a chart depicting relations of back surface electrode adhesion and deposition conditions of the nickel layer configuring the back surface electrode multilayered structure of the silicon carbide semiconductor device according to the embodiment. FIG. 6 depicts for each deposition rate (Ni deposition rate) of the nickel layer 6 and for each thickness (Ni layer thickness) of the nickel layer 6, whether there was back surface electrode peeling. In FIG. 6, "○: no peeling" indicates that neither the nickel silicide layer 4 nor the back surface electrode multilayered structure 8 peeled. "Δ: negligible peeling" indicates that the nickel silicide layer 4 or the back surface electrode multilayered structure 8 partially peeled but the peeling was to an extent that was not detrimental to product performance. "x: peeling" indicates that the nickel silicide layer 4 or the back surface electrode multilayered structure 8 completely peeled. From the results depicted in FIG. 6, it was confirmed that the adhesion of the back surface electrode drops and peeling of the back surface electrode occurs the thicker the nickel layer 6 is and the faster the deposition rate of the nickel layer 6 is.

Figure 7:
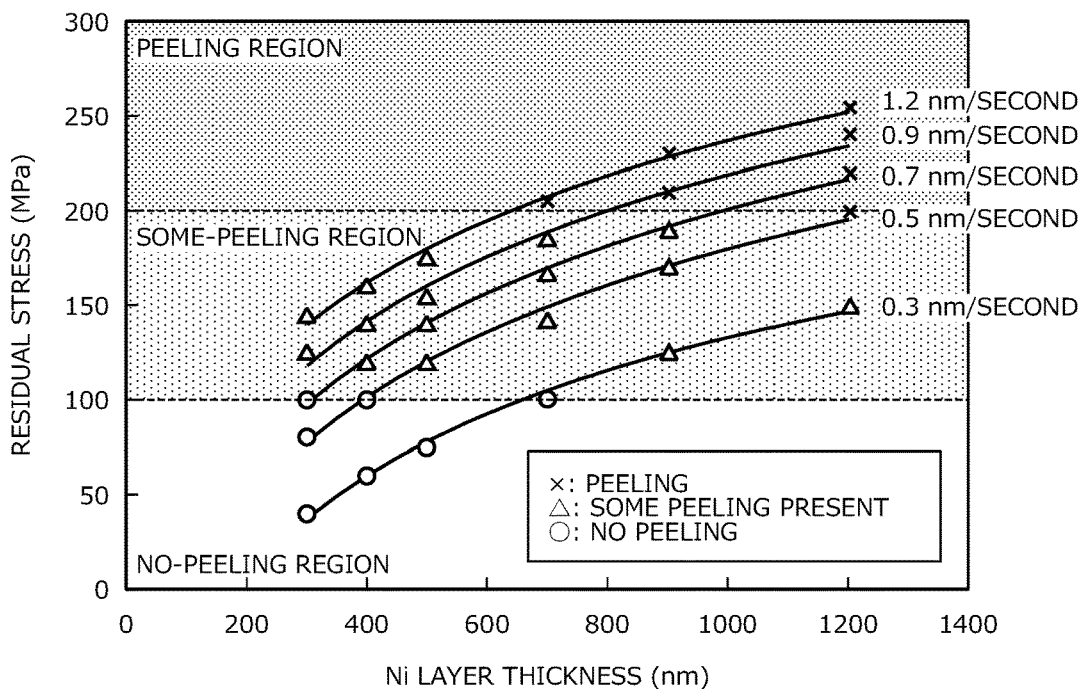
FIG. 7 is a graph depicting relations of residual stress of the nickel layer and deposition conditions of the nickel layer configuring the back surface electrode multilayered structure of the silicon carbide semiconductor device according to the embodiment.

FIG. 7 depicts relations of the residual stress σ of the nickel layer 6 calculated using equation (4) and thickness and deposition rate of the nickel layer 6. FIG. 7 is a graph depicting relations of the residual stress of the nickel layer and the deposition conditions of the nickel layer configuring the back surface electrode multilayered structure of the silicon carbide semiconductor device according to the embodiment. FIG. 7 depicts according to deposition rate of the nickel layer 6, fitted curves of the residual stress σ of the nickel layer 6 when the thickness of the nickel layer 6 (Ni layer thickness) is changed. FIG. 7 further depicts the experimental results for back surface electrode adhesion depicted in FIG. 6 (○: no peeling, Δ: some peeling present (corresponds to "negligible peeling" in FIG. 6), x: peeling).

From the results depicted in FIG. 7, it was confirmed that the residual stress σ of the nickel layer 6 becomes smaller the thinner the nickel layer 6 is and the slower the deposition rate of the nickel layer 6 is. Further, it was confirmed that when the residual stress σ of the nickel layer 6 is 200 MPa or less, a state of "○: no peeling" or "Δ: some peeling present" occurs irrespective of the thickness and the deposition rate of the nickel layer 6 and that the peeling of the back surface electrode can be suppressed (residual stress range in which Δ mark is distributed (hereinafter, some-peeling region) and residual stress range in which ○ mark is distributed (hereinafter, no-peeling region)). Further, it was confirmed that when the residual stress σ of the nickel layer 6 is 100 MPa or less, a state of "○: no peeling" occurs irrespective of the thickness and deposition rate of the nickel layer 6 and that no peeling of the back surface electrode occurs (no-peeling region).

On the other hand, it was further confirmed that the residual stress σ of the nickel layer 6 becomes larger the thicker the nickel layer 6 is and the faster the deposition rate of the nickel layer 6 is. It was confirmed that when the residual stress σ of the nickel layer 6 exceeds 200 MPa, a state of "x: peeling" occurs irrespective of the thickness and deposition rate of the nickel layer 6 and that peeling between the SiC wafer 1 and the nickel silicide layer 4, and between the nickel silicide layer 4 and the back surface electrode multilayered structure 8 occurs (residual stress range in which x mark is distributed (hereinafter, peeling region)). Therefore, it was confirmed that by making the nickel layer 6 thin and the deposition rate of the nickel layer 6 slow such that the allowable range of the residual stress σ of the nickel layer 6 is 200 MPa or less and the residual stress σ of the nickel layer 6 is 200 MPa or less and preferably, 100 MPa or less, the occurrence of back surface electrode peeling can be suppressed.

Figure 8:
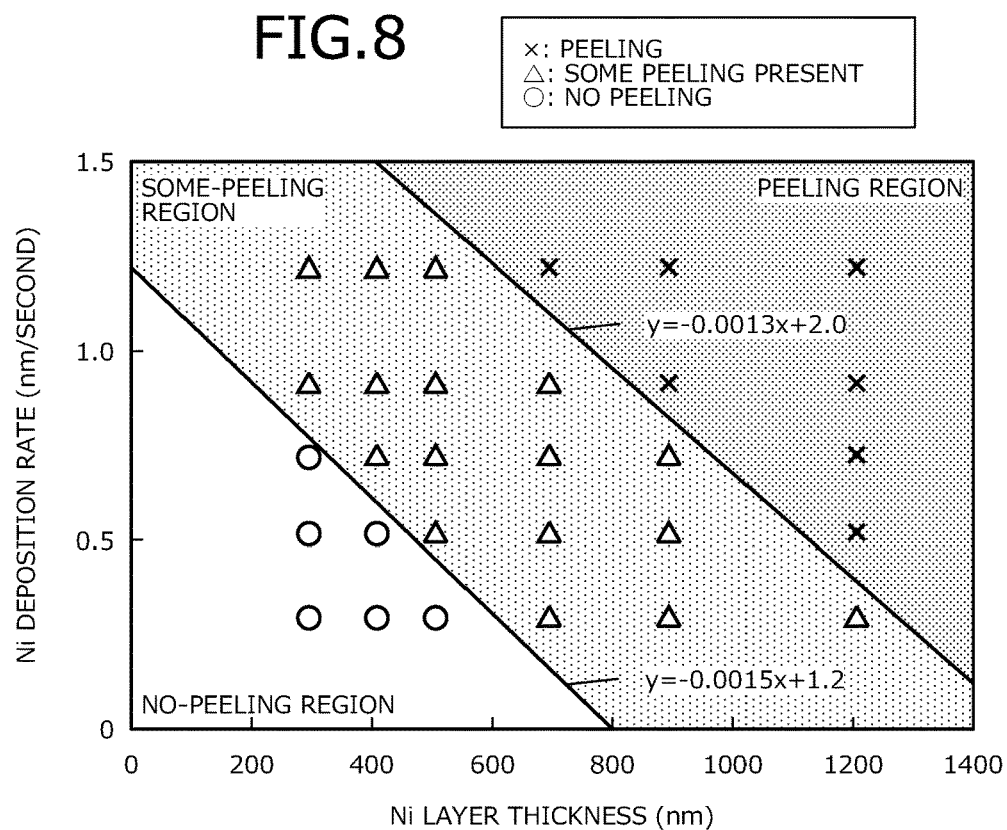
FIG. 8 is a graph depicting relations of deposition rate of the nickel layer and thickness of the nickel layer configuring the back surface electrode multilayered structure of the silicon carbide semiconductor device according to the embodiment.

Thickness and deposition rate relations for the nickel layer 6, derivable from the results in FIG. 6 will be described. FIG. 8 is a graph depicting relations of the deposition rate of the nickel layer and the thickness of the nickel layer configuring the back surface electrode multilayered structure of the silicon carbide semiconductor device according to the embodiment. FIG. 8 depicts relations of the no-peeling region, the some-peeling region, and the peeling region, where the horizontal axis represents the thickness of the nickel layer 6 (Ni layer thickness) and the vertical axis represents the deposition rate (Ni deposition rate) of the nickel layer 6. As depicted in FIG. 8, as the thickness of the nickel layer 6 approaches the thick side from the thin side and the deposition rate of the nickel layer 6 approaches the fast side from the slow side, in the sequence of the no-peeling region, the some-peeling region, and the peeling region, the regions are layered-shape adjacent to one another without crossing.

Further, from the results depicted in FIG. 8, it was confirmed that the boundary of the peeling region and the some-peeling region is expressed by equation (5) and the boundary of the some-peeling region and the no-peeling region is expressed by equation (6), where thickness of the nickel layer 6 is x [nm] and the deposition rate of the nickel layer 6 is y [nm/second]. Therefore, it was confirmed that by determining the thickness of the nickel layer 6 and the deposition rate of the nickel layer 6 to be more toward the origin (0, 0) than equation (5) (i.e., within a range satisfying expression (2)), the peeling of the back surface electrode can be suppressed. Further, it was confirmed that by determining the thickness of the nickel layer 6 and the deposition rate of the nickel layer 6 to be more toward the origin (0, 0) than equation (6) (i.e., within a range satisfying expression (3)), the back surface electrode does not peel. For example, when the thickness of the nickel layer 6 is 400 nm, by setting the deposition rate of the nickel layer 6 to be 0.5 nm/second or less, peeling of the back surface electrode can be prevented.

$$y = -0.0013x + 2.0 \quad (5)$$

$$y = -0.0015x + 1.2 \quad (6)$$

As described, according to the embodiment, by determining the thickness of the nickel layer and the deposition rate of the nickel layer such that the residual stress of the nickel layer configuring the back surface electrode multilayered structure is 200 MPa or less, adhesion of the SiC wafer and nickel silicide layer and adhesion of the nickel silicide layer and the back surface electrode multilayered structure can be enhanced. As a result, peeling of back surface electrode (nickel silicide layer and back surface electrode multilayered structure) can be sufficiently suppressed, enabling the production of a particularly favorable silicon carbide semiconductor device having a back surface electrode realizing ohmic contact with the SiC wafer.

The invention is not limited to the embodiments described and various modifications are possible without departing from the scope of the invention. For example, in the description, although an example in the case of forming an ohmic contact of the SiC wafer and the back surface electrode is described, the invention is further applicable in a case where an ohmic contact is formed between the SiC wafer and a front surface electrode. The present invention is further applicable to a silicon carbide semiconductor device that has a metal electrode formed as an ohmic contact with the SiC wafer and, for example, is applicable to various devices such as a metal oxide semiconductor field effect transistor (MOSFET), an insulated gate bipolar transistor (IGBT), and Schottky diode. Further, in the described embodiment, in place of the SiC wafer, an epitaxial wafer having a SiC epitaxial layer stacked on a SiC wafer may be used. In the described embodiment, although a case is described where an n-type semiconductor region is formed in the surface layer of the back surface of an n-type SiC wafer, a p-type impurity may be formed by ion implanting a p-type impurity in the back surface of an n-type SiC wafer. Further, the present invention can be implemented even if the conductivity of the semiconductor layer or the semiconductor substrate (n-type, p-type) is reversed in the described embodiment.

According to the described invention, the thickness and deposition rate of the nickel layer is determined such that the residual stress of the nickel layer configuring the metal electrode multilayered structure is 200 MPa or less, whereby adhesion of the silicon carbide substrate and the metal layer, and adhesion of the metal layer and the back surface electrode multilayered structure can be enhanced. As a result, the peeling of the electrode (metal layer and metal electrode multilayered structure) on the silicon carbide substrate can be suppressed.

The silicon carbide semiconductor device and the manufacturing method of the silicon carbide semiconductor device according to the present invention enable suppression of peeling of the back surface electrode.

As described, the silicon carbide semiconductor device and the manufacturing method of the silicon carbide semiconductor device according to the present invention is useful for a power semiconductor apparatus having a metal electrode forming an ohmic contact with a silicon carbide semiconductor.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
a metal layer disposed on a semiconductor substrate of silicon carbide and forming an ohmic contact with the semiconductor substrate, the metal layer being a nickel silicide layer that has titanium carbide distributed therein; and
a metal electrode multilayered structure formed by sequentially stacking at least a titanium layer and a nickel layer on the metal layer,
wherein residual stress of the nickel layer is 200 MPa or less, and
wherein a thickness of the nickel layer is 400-1200 nm.

2. The silicon carbide semiconductor device according to claim 1, wherein
the residual stress of the nickel layer is 100 MPa or less.

3. The silicon carbide semiconductor device according to claim 1, wherein
the nickel layer is formed under a condition satisfying $0.0 < y < -0.0013x + 2.0$, where thickness of the nickel layer is x [nm] and deposition rate of the nickel layer is y [nm/second].

4. The silicon carbide semiconductor device according to claim 3, wherein the nickel layer is formed to under a condition satisfying $0.0 < y < -0.0015x + 1.2$.

5. A manufacturing method of a silicon carbide semiconductor device, the manufacturing method comprising:
forming a metal layer on a semiconductor substrate of silicon carbide, the metal layer being a nickel silicide layer that has titanium carbide distributed therein;
forming an ohmic contact of the semiconductor substrate and the metal layer by heat treatment; and
forming a metal electrode multilayered structure by sequentially stacking at least a titanium layer and a nickel layer on the metal layer, wherein
the forming of the metal electrode multilayered structure includes forming the nickel layer under a condition satisfying $0.0 < y < -0.0013x + 2.0$, where thickness of the nickel layer is x [nm] and deposition rate of the nickel layer is y [nm/second], and
wherein a thickness of the nickel layer is 400-1200 nm.

6. The manufacturing method of the silicon carbide semiconductor device according to claim 5, wherein
the forming of the metal electrode multilayered structure includes forming the nickel layer under a condition satisfying $0.0 < y < -0.0015x + 1.2$.

7. The manufacturing method of the silicon carbide semiconductor device according to claim 5, wherein
the forming of the metal electrode multilayered structure includes forming the nickel layer by a vapor-deposition method.

8. The manufacturing method of the silicon carbide semiconductor device according to claim 5, wherein
the forming of the metal layer includes forming on the semiconductor substrate, the metal layer, which includes titanium and nickel, and
the forming of the ohmic contact includes reacting the semiconductor substrate and the metal layer by heat treatment, forming a nickel silicide layer that includes titanium carbide, and forming an ohmic contact of the semiconductor substrate and the nickel silicide layer.

9. The silicon carbide semiconductor device of claim 1, wherein the thickness of the nickel layer is 400-500 nm.

10. The silicon carbide semiconductor device of claim 1, wherein the thickness of the nickel layer is 400 nm and the deposition rate of the nickel layer is 0.5 nm/second or less.

* * * * *